US008647794B2

(12) United States Patent
McCloskey et al.

(10) Patent No.: US 8,647,794 B2
(45) Date of Patent: *Feb. 11, 2014

(54) METHOD OF FORMING HOLOGRAMS IN POLYMER COMPOSITES WITH CONFINED CRYSTALLIZATION

(75) Inventors: Patrick Joseph McCloskey, Watervliet, NY (US); Amitabh Bansal, Rhinebeck, NY (US); Warren William Reilly, Northville, NY (US)

(73) Assignee: General Electric Company, Niskayuna, NY (US)

( * ) Notice: Subject to any disclaimer, the term of this patent is extended or adjusted under 35 U.S.C. 154(b) by 823 days.

This patent is subject to a terminal disclaimer.

(21) Appl. No.: 12/391,689

(22) Filed: Feb. 24, 2009

(65) Prior Publication Data

US 2010/0216059 A1    Aug. 26, 2010

(51) Int. Cl.
*G03H 1/02*    (2006.01)

(52) U.S. Cl.
USPC ........................................ 430/1; 430/2; 359/3

(58) Field of Classification Search
None
See application file for complete search history.

(56) References Cited

U.S. PATENT DOCUMENTS

| 7,018,684 | B2 | 3/2006 | Berneth et al. | |
|---|---|---|---|---|
| 2005/0112358 | A1 | 5/2005 | Potyrailo et al. | |
| 2006/0057372 | A1 | 3/2006 | Dollase et al. | |
| 2008/0158627 | A1* | 7/2008 | Lawrence et al. | 359/7 |
| 2010/0216058 | A1* | 8/2010 | McCloskey et al. | 430/2 |

OTHER PUBLICATIONS

Shih-Kai Materials Chemistry and Physics 78 (2003)581-590.*
Schaertl et al., "FRS study of diffusional process in block copolymer/homopolymer blends containing glassy spherical micelles", Macromol. vol. 29(16) pp. 5297-5307 (1996).*
Akiba et al. Macromolecules vol. 32 No. 4 pp. 1175-1179 (1999).*
George et al. Biomaterials 30 (2009) pp. 2449-2456.*
Loo et al. Physics Review Letters vol. 84, No. 18, pp. 4120-4123(2000).*
Park et al. Polymer Chemistry vol. 46,8041-8048(2008).*
Sandoval et al. Polymer Preprints 49(2), 135(2008).*
Sigma Aldrich PEO PEG(2011).*
Sigma Aldrich PEO-PEG(2012).*
Zhao et al., "Azobenzene-containing block copolymers:the interplay of light and morphology enables new functions", Soft Matter, vol. 5 pp. 2686-2693 (2009).*
He et al., "Synthesis and chracterization of side chain liquid crystalline ABC triblock copolymers . . .", J. Poly. Sci. Pt A., Poly. Chem., vol. 46 pp. 4442-4450 (2008).*
Yu et al., "Enhancement of surface relief gratings recorded on amphillic liquid crystalline diblock copolymer . . .", Adv. Mater., vol. 17pp. 2184-2188 (2005).*
Zhao et al., "Rational design of light-controllable polymer micelles", The Chem. Rec., vol. 7 pp. 286-294 (2007).*
Birnkrant et al., "On the Structure of Holographic Polymer-Dispersed Polyethylene Glycol", Polymer, vol. 47, Issue 24, pp. 8147-8154, 2006.
Cheng et al., "Synthesis of Block Copoly(polyethylene glycol-styrene) by the Macromonomer and Macroinitiator Method", Materials Chemistry and Physics, vol. 78, pp. 581-590, 2003.
Müller et al., "Crystallization in Block Copolymers with More than One Crystallizable Block", Progress in Understanding of Polymer Crystallization, vol. 714, pp. 229-259, 2007.
Sato et al., "UCST and LCST Behaviour in Polymer Blends Containing Poly(methyl methacrylate-stat-styrene)", Polymer, vol. 39, No. 4, pp. 773-780, 1998.
Vernel et al., "Physical Aging in Poly(ethylene oxide)/atactic-poly(methyl methacrylate) Blends", Thermochim. Acta, vol. 342, pp. 115-137, 1999.

* cited by examiner

*Primary Examiner* — Martin Angebranndt
(74) *Attorney, Agent, or Firm* — Joseph J. Christian

(57) ABSTRACT

A polymer composite prepared by melt blending, comprising an amorphous polymer; and a crystallizable polymer; wherein upon cooling the polymer composite, the amorphous polymer forms a continuous phase and the crystallizable polymer forms a dispersed phase, and wherein the dispersed phase is less than 200 nanometers in size.

5 Claims, No Drawings

US 8,647,794 B2

METHOD OF FORMING HOLOGRAMS IN POLYMER COMPOSITES WITH CONFINED CRYSTALLIZATION

FIELD OF THE INVENTION

The invention includes embodiments that relate to a polymer composite. More particularly, the invention includes embodiments that relate to an optically clear polymer composite with confined crystallization for use in holographic data storage.

BACKGROUND OF THE INVENTION

Optically clear plastics that demonstrate confined crystallization are useful for various applications including holographic data storage. Materials which exhibit the ability to undergo a threshold phase change and concomitant change in refractive index have been reported as a potential method to read and write holograms in a suitable storage media. However, a commercially viable material has yet to be discovered. Accordingly, there is a need for improved materials which exhibit confined crystallization and are easily processed, through which enhanced holographic data storage applications can be achieved.

BRIEF SUMMARY OF THE INVENTION

In one embodiment, a polymer composite prepared by melt blending, comprises an amorphous polymer; and a crystallizable polymer; wherein upon cooling the polymer composite, the amorphous polymer forms a continuous phase and the crystallizable polymer forms a dispersed phase, and wherein the dispersed phase is less than 200 nanometers in size.

In another embodiment, a method for storing holographic data, comprises the steps of (a) providing an optically transparent substrate comprising a polymer composite and a light absorbing chromophore, wherein the polymer composite is prepared by melt blending and comprises an amorphous polymer; and a crystallizable polymer; wherein upon cooling the polymer composite, the amorphous polymer forms a continuous phase and the crystallizable polymer forms a dispersed phase, and wherein the dispersed phase is less than 200 nanometers in size; and (b) irradiating a volume element of the optically transparent substrate with a holographic interference pattern, wherein the pattern has a first wavelength and an intensity both sufficient to cause a phase change in at least a portion of the dispersed phase within the volume element of the substrate to produce within the irradiated volume element refractive index variations corresponding to the holographic interference pattern, thereby producing an optically readable datum corresponding to the volume element.

DETAILED DESCRIPTION OF THE INVENTION

Some aspects of the present invention and general scientific principles used herein can be more clearly understood by referring to U.S. patent application Ser. No. 11/901,725, filed on Sep. 18, 2007, which is incorporated herein by referenced in its entirety.

As defined herein, the term "optically transparent" as applied to an optically transparent substrate or an optically transparent plastic material means that the substrate or plastic material has an absorbance of less than 1. That is, at least 10 percent of incident light is transmitted through the material at least one wavelength in a range between about 300 to about 800 nanometers. For example, when configured as a film having a thickness suitable for use in holographic data storage said film exhibits an absorbance of less than 1 at least one wavelength in a range between about 300 and about 800 nanometers.

As defined herein, the term "volume element" means a three dimensional portion of a total volume.

As defined herein, the term "optically readable datum" can be understood as a datum that is stored as a hologram patterned within one or more volume elements of an optically transparent substrate.

Disclosed herein are optically transparent polymer composites comprising an amorphous polymer and a crystallizable polymer. The composite is formed by melt blending the amorphous polymer and the crystallizable polymer using any method known to those skilled in the art. In one embodiment, the polymers are melt blended via an extrusion process. The temperature used during the melt blending process will depend on the specific polymers used to form the composite. For example, the materials can be melt blended at a temperature between about 200 degrees Celsius and about 300 degrees Celsius. In one embodiment, the polymers are melt blended at a temperature between about 240 degrees Celsius and about 280 degrees Celsius.

The melt blend composition is then cooled to a temperature that is below the glass transition temperatures of the polymers therein. Desirably the cooling takes place rapidly, to maintain transparency. In one embodiment, the melt blend composition is cooled in less than 20 seconds. The composition can be cooled by any method known to those skilled in the art. For example, the melt blend composition can be cooled by immersion in dry ice. Upon cooling the melt blend composition, the amorphous polymer forms a continuous phase and the crystallizable polymer forms a dispersed phase.

The cooled polymer composite may then be extruded and/or injection molded to form pellets, a substrate (e.g. a film, disc), and the like. The polymer composite, and substrates comprised thereof, are particularly useful in data storage media, including holographic data storage. In one embodiment, extruded pellets formed from the polymer composite are injection molded into discs suitable for holographic data storage.

As stated above, the polymer composite may be formed under conditions as to produce a composite, or article comprising the composite, that has a continuous amorphous phase comprising the amorphous polymer and a crystalline dispersed phase comprising the crystallizable polymer. Alternatively, conditions may be controlled so that the dispersed phase crystallizable polymer is amorphous. The crystallizable polymer may be dispersed in the amorphous polymer, whereby the crystallizable polymer is incorporated into or grafted onto an amorphous block copolymer backbone.

In one embodiment the polymer composite comprises a crystallizable polymer dispersed phase that has a degree of crystallinity between about 0.01 percent and about 100 percent at a temperature below the glass transition temperature of the composite. In one embodiment, the crystallizable polymer has a degree of crystallinity between about 15 percent and about 80 percent at a temperature below the glass transition temperature of the composite. In another embodiment, the crystallizable polymer has a degree of crystallinity between about 25 percent and about 60 percent at a temperature below the glass transition temperature of the composite. In yet another embodiment, the crystallizable polymer has a degree of crystallinity of at least 10 at a temperature below the glass transition temperature of the composite. The crystallizable polymer present in the composite can be thermally or optically induced to change from an amorphous phase to a crystalline phase or vice versa. This change in the crystallizable polymer phase results in a change in the refractive index of the polymer composite.

Micro-phase separation of the polymer composite can be induced upon a brief or extended heating or annealing of the composite above the glass transition temperature (Tg) of the composite and/or melting temperature (Tm) of the crystallizable polymer. The resulting microphase separated polymer composite is amorphous when the annealing temperature is higher than the melting point and glass transition temperature of the crystallizable polymer. Upon cooling to low temperatures which are close to or below the crystallization temperature (Tc) of the dispersed crystallizable polymer, the dispersed crystallizable polymer crystallizes, while maintaining the shapes of the original micro-phases. The polymers microphase separate into very small domains and the domain size is determined by the molecular weights of the individual polymer blocks. Typically, the dispersed phase formed by the crystallizable polymer takes the form of tiny domains having a size less than about 200 nanometers (nm). This means that while the domains of the dispersed phase may vary in size, on average the longest path length across a domain of the dispersed phase will be less than about 200 nm in length. In one embodiment, the average longest path length across a domain of the dispersed phase will be less than about 100 nm in length. In another embodiment, the average longest path length across a domain of the dispersed phase will be less than about 50 nm in length. In yet another embodiment, the average longest path length across a domain of the dispersed phase will be less than about 40 nm in length. The domains of the dispersed phase are distributed essentially uniformly throughout the continuous phase. The weight ratio of the amorphous polymer and crystallizable polymer can be used to control the geometry of the individual microphases. For example the crystallizable polymer dispersed phase may be in the form of spheres, cylinders, etc. within the amorphous polymer continuous phase.

Examples of suitable amorphous polymers for use in the composite include, but are not limited to polystyrenes, including a homopolymer or a copolymer of polystyrene such as poly(styrene-co-methyl methacrylate) (PS-PMMA) and polystyrene bisphenol A copolymer; polymethylmethacrylate (PMMA); polycarbonates including BPA-polycarbonate; polyethylene terephthalate (PET); polyethers, including polyetherimides; polyesters; and crosslinked epoxy. Examples of commercially available amorphous polymers include Lexan® resin and Xylex® resin, both available from SABIC Innovative Plastics, Pittsfield Mass.; and OKP4 resin and PKP4 HT resin, both available from Osaka Gas Chemical Company Ltd., Kansai, Japan. In an exemplary embodiment, the amorphous polymer comprises poly(styrene-co-methyl methacrylate).

Examples of suitable crystallizable polymers include polyethylene glycol (PEG), nylon, polyalkenes, polybutylterapthalate, polyethylene terapthalate, polyvinyl acetate, polyvinyl chloride, polyphenyl sulphone, and polycaprolactone. In an exemplary embodiment, the first polymer is comprised of polyethylene glycol.

The polymer composite may comprise from about 50 weight percent to about 90 weight percent of the amorphous polymer, based on the total weight of the composite. In an exemplary embodiment, the composite comprises from about 70 weight percent to about 85 weight percent of the amorphous polymer.

The polymer composite may comprise from about 10 weight percent to about 50 weight percent of the crystallizable polymer, based on the total weight of the composite. In an exemplary embodiment, the composite comprises from about 15 weight percent to about 30 weight percent of the crystallizable polymer.

The polymer composite is optically transparent. As used herein, "optical transparency" is defined as the percent of incident light that is transmitted through the terpolymer at least one wavelength in a range between about 300 to about 800 nanometers. The polymer composite may have an optical transparency of at least about 65 percent. In another embodiment, the polymer composite has an optical transparency of at least about 75 percent. In yet another embodiment, the polymer composite has an optical transparency of at least about 85 percent.

For holographic data storage applications, it is useful that the morphology of the polymer composite after microphase separation remains unchanged during further crystallization and/or melting of the crystallizable polymer forming the dispersed phase. The continuous and the dispersed phases are at times also referred to as the majority and minority blocks respectively. Such a condition can be easily met if the majority block, also referred to as the matrix, is in a glassy or highly cross-linked state during crystallization of the minority block. In other words, it is useful that the polymer composite for holographic data storage applications is formed such that the temperature for order-disorder transition of the polymer composite is higher than the glass transition of the continuous phase (majority block) and that the latter is higher than the crystallization and melting temperatures of the dispersed phase (minority block): $T_{order-disorder} > T_{g\ (matrix)} > T_{crystallization\ (dispersed\ phase)}$ and $T_{m\ (dispersed\ phase)}$.

Holographic data storage relies upon the introduction of localized variations in the refractive index of the optically transparent substrate comprising the photochemically active dye as a means of storing holograms. The refractive index within an individual volume element of the optically transparent substrate may be constant throughout the volume element, as in the case of a volume element that has not been exposed to electromagnetic radiation, or in the case of a volume element in which the photosensitive component has been irradiated to the same degree throughout the volume element. It is believed that most volume elements that have been exposed to electromagnetic radiation during the holographic data writing process will contain a complex holographic pattern, and as such, the refractive index within the volume element will vary across the volume element. In instances in which the refractive index within the volume element varies across the volume element, it is convenient to regard the volume element as having an "average refractive index" which may be compared to the refractive index of the corresponding volume element prior to irradiation. Thus, in one embodiment an optically readable datum comprises at least one volume element having a refractive index that is different from a (the) corresponding volume element of the optically transparent substrate prior to irradiation.

Data storage is traditionally achieved by locally changing the refractive index of the data storage medium in a graded fashion (continuous sinusoidal variations), rather than discrete steps, and then using the induced changes as diffractive optical elements.

Volumetric optical storage systems have the potential to fulfill demands for high-capacity data storage. Unlike traditional optical disc storage formats, such as compact disc (CD) and digital versatile disc (DVD) formats, where the digital information is stored in a single (or at most two) reflective layer(s), according to an aspect of the present invention, the holograms representing digital content are stored as localized refractive index alterations in a plurality of volumes arranged in stacked (e.g. vertically), directed (e.g. laterally) tracks in the storage medium. Each of the laterally directed tracks may define a corresponding laterally, e.g., radially, directed layer.

According to an aspect of the present invention, single bits, or groups of bits, of data may be encoded as individual micro-holograms each substantially contained in a corresponding volume element. In one embodiment, the medium, or media, takes the form of an injection moldable thermoplastic disc, and exhibits one or more non-linear functional characteristics. The non-linear functional characteristics may be embodied as a refractive index change that is a non-linear function of exposure to an energy source, such as a holographic interference pattern (incident optical intensity), or heat. In such embodiments, by generating interference fringes within a given volume element of the medium, one or more bits of data may be selectively encoded in that volume element as detectable refractive index modulations which represent the stored holographic data.

According to an aspect of the present invention, a non-linear functional characteristic may establish a threshold energy responsive condition, below which no substantial change in refractive index occurs in the optically transparent substrate, and above which measurable changes in the refractive index of the optically transparent substrate are induced. In this manner, holographic data stored within a selected volume element of the optically transparent substrate can be read, or recovered, by exposure of the data-containing volume element to a read beam having an effective energy less than the threshold energy. Similarly, holographic data can be written or erased using a light beam having an effective energy in excess of the threshold energy. Accordingly, in one embodiment, dense matrices of volumes that each may, or may not, have a micro-hologram substantially contained therein may be established. Each of the micro-holograms is embodied in the optically transparent substrate as an alternating pattern of sub-regions having differing refractive indices, which correspond to the interference fringes of counter-propagating light beams used to write the micro-holograms. Where the refractive index modulation decays rapidly as a function of distance from a target volume, such as an encoded bit center, the more densely the volumes may be packed.

According to an aspect of the present invention, the refractive index changes in a particular volume element may be induced by localized heating patterns corresponding to the interference fringes of counter-propagating laser beams passing through the volume element. In one embodiment, the refractive index change results from a density difference between an amorphous state and a crystalline state of a thermoplastic medium. A transition from one state to the other state may be selectively induced within target volume elements within the medium by thermally activating the target volume elements by exposure of the target volume elements to the interference fringes of a holographic interference pattern.

In one embodiment, the present invention provides a method for storing holographic data within an optically transparent substrate comprising the polymer composite described herein, wherein the polymer composite has a continuous phase and a dispersed phase.

In one embodiment, the polymer composite is selected such that the dispersed phase is initially present in the polymer composite in an amorphous state or a crystalline state. As the optically transparent substrate comprising the polymer composite having the continuous phase and the dispersed phase is irradiated with a holographic interference pattern, a light absorbing chromophore present in the polymer composite absorbs light and creates hot spots as a function of the intensity of the holographic interference pattern. The hot spots correspond to regions of constructive interference within the holographic interference pattern. The heat generated within the regions of constructive interference causes that portion of the dispersed phase within a hot spot to undergo a phase change from either an amorphous state to a crystalline state, or from a crystalline state to an amorphous state. Although heat dissipates into the surrounding polymer composite after irradiation, the temperature rise outside of the hot spots is insufficient to effect a phase change of the dispersed phase outside of the hot spots.

Changes in the refractive index within the optically transparent substrate corresponding to an optically readable datum can occur by a variety of mechanisms as the optically transparent substrate is exposed to the holographic interference pattern. In a first instance, localized heating within the regions of constructive interference causes the dispersed phase to coalesce with the continuous phase in the region of the hot spot thereby creating refractive index gradients. In a second instance, the polymer composite comprising a dispersed phase and a continuous phase undergoes an order to disorder transition upon heating within the regions of constructive interference of the holographic interference pattern. In one embodiment, the phase change occurring in the hot spots results in an increase in an initial refractive index mismatch between the continuous phase and the dispersed phase. In an alternate embodiment, the phase change occurring in the hot spots results in a decrease in an initial refractive index mismatch between the continuous phase and the dispersed phase. In yet another embodiment, the phase change occurring in the hot spots results in the creation of a refractive index mismatch between the continuous phase and the dispersed phase.

According to an aspect of the present invention, loss of dynamic range in affected volume elements other than the target volume element during hologram formation is mitigated by using a recording material exhibiting a non-linear response to experienced power density. In other words, an optically transparent substrate exhibiting a non-linear recording property may be used in combination with the formation of a micro-hologram. The non-linear recording property of the optically transparent substrate is used to facilitate recording of holograms within the optically transparent substrate that is non-linear with light intensity (e.g. square, cubic, or of the threshold type), such that recording occurs only above a certain threshold light intensity. Such a non-linear recording characteristic of the optically transparent substrate reduces or eliminates loss of dynamic range in non-addressed volume elements, and facilitates reduction of the dimensions of the micro-holograms, and target volume elements.

In one embodiment, the light absorbing chromophore is a linearly responsive absorber. In certain embodiments, the light absorbing chromophore is a reverse saturable absorber and good control in localizing the heat produced as holograms are written into the optically transparent substrate is achieved. Lateral extension of the micro-holograms may be significantly smaller than the diameter of the waist of the focused laser beam(s). Limiting or eliminating consumption of dynamic range of the recording material outside of the recorded micro-holograms, hence increasing reflectivity of each micro-hologram and therefore data storage capacity, may thus be realized through the use of a non-linear recording medium according to an aspect of the present invention. In one embodiment, the light absorbing chromophore is dissolved in one of the phases, preferably the crystallizable polymer phase. In an alternate embodiment, the light absorbing chromophore is attached to one or more of the blocks of a block copolymer. The block copolymer bearing the light absorbing chromophore may then be molded or otherwise processed (solvent cast, extruded) into an optically transparent substrate within which holographic interference patterns may be recorded and from which optically readable data may be recovered. In one embodiment, "A" represents the fully amorphous block, "B" represents the crystallizable block, and "D" represents a linear or RSA type of dye. The dye molecule "D" can be simply added to the copolymer upon processing, in which case the dye will distribute between the two polymer phases based on its partition coefficient. Functionality can be added to the dye molecule to preferentially cause it to be more soluble in one phase than the other phase. Alternatively, the dye molecule can be attached to the block copolymer in various ways. For instance, a triblock or multi-block copolymer can be formed of the type "ABD" or "DBABD". In one embodiment, the dye molecule will concentrate in the center of the "B" phase, a multiblock copolymer. In an alternate embodiment, the dye molecule forms a shell around the B-phase. In one embodiment, the polymer composite used to prepare the optically transparent substrate is a multiblock copolymer of the type "ADB" or "BDADB" containing a dye, and wherein the dye is concentrated near the interface between the "A" and "B" phases. In another embodiment, an "A"-type homopolymer end-capped with a light absorbing chromophore "D" (represented here as "AD") is blended with an "AB" type block copolymer to form a blend composition from which the optically transparent substrate may be prepared. Depending on the affinity of the light absorbing chromophore for the "A" block or "B" block constituents the light absorbing chromophore "D" may concentrate in the "A" block phase, the "B" block phase, or be concentrated at the interface between the "A" block phase, the "B" block phase of the polymer composite. In an alternate embodiment, the polymer composite comprises an "AB" block copolymer having a dispersed phase and a continuous phase, an "A"-type homopolymer end-capped with a light absorbing chromophore "D" (represented here as "AD"), and a "B"-type homopolymer end-capped with a light absorbing chromophore "D" (represented here as "BD") wherein the light absorbing chromophore "D" is concentrated at the interface between the continuous phase and the dispersed phase, is concentrated in the continuous phase, or is concentrated in the dispersed phase.

The following examples are intended only to illustrate methods and embodiments in accordance with the invention and as such should not be construed as imposing limitations upon the claims.

EXAMPLES

Example 1

Melt Blending of PS-PMMA and Polyethylene Glycol

Composites comprising varying concentrations of poly(styrene-co-methyl methacrylate) (PS-PMMA) and PEG were formed by melt blending the materials using the following method. A mixture of PS-PMMA (40% PS) pellets and polyethylene glycol was heated between 260 and 280 degrees Celsius under nitrogen with mechanical stirring in a 1.0 liter glass reactor until a homogeneous, clear melt was observed at 10 to 15 minutes. A vacuum can be applied upon achieving a molten mixture, thereby causing the material to foam and improve mixing. The material was then discharged from the reactor after a clear melt was obtained. Material quenched in dry ice to room temperature remained completely transparent. In contrast, material allowed to slowly air cool to room temperature turned opaque on standing. Differential Scanning Calorimeter (DSC) analysis of the materials in this state indicated no crystallinity upon heating from room temperature to above the expected Tm of the composite, indicating they were amorphous. Upon cooling to −60 degrees Celsius and subsequently heating to 150 degrees Celsius in the DSC, the crystallization temperature (Tc), heat of crystallization ($\Delta H_{cryst}$), melting temperature (Tm), and heat of melting ($\Delta H_{melt}$) were determined. The results are displayed on next page in Table 1.

TABLE 1

| PS-PMMA (wt %) | PEG $M_n$ | PEG (wt %) | PEG (wt % incorporation into PS-PMMA) | Tc (° C.)/$\Delta H_{cryst}$ (J/g) | Tm (° C.)/$\Delta H_{melt}$ (J/g) |
|---|---|---|---|---|---|
| 75 | 2000 | 25 | 39 | none observed | 51.9/0.99 |
| 75 | 4600 | 25 | 51 | −20.6/15 | 63/21.3 |
| 75 | 8000 | 25 | 45 | −19.9/10.3 | 62.6/17.5 |
| 75 | 8000 | 25 | 28 | −21.2/15.7 | 63.6/21.8 |
| 75 | 10000 | 25 | 48 | −21.1/15.4 | 64/24.6 |
| 85 | 10000 | 15 | 24 | −19.5/10.5 | 63/16.2 |
| 75 | 5000 | 25 | 52 | −18.4/21.2 | 60.8/35.1 |
| 75 | 5000 | 25 | 48 | −20.6/13.5 | 55/23.7 |

Example 2

Melt Blending of PS-PMMA and Polyethylene Glycol Via Extrusion

Composites comprising varying concentrations of PS-PMMA and PEG were formed by melt blending the materials via extrusion using the following method. PS-PMMA pellets were tumble mixed with solid polyethylene glycol flakes and fed at a rate of 4-6 lbs/hr to a 28 mm twin screw extruder equipped with a vacuum vent. The barrel temperature was 260 degrees Celsius and the screw speed was 200-300 rpms. Clear to translucent pellets were obtained. The crystallization temperature (Tc), heat of crystallization ($\Delta H_{cryst}$), melting temperature (Tm), and heat of melting ($\Delta H_{melt}$) were determined. The results are displayed in Table 2.

Example 3

Formation of PS-PMMA/PEG Discs

Pellets of the PS-PMMA/PEG blend formed in Example 2 were tumble mixed with a phthalocyanine dye in powder form. This solid blend was fed to a micro Dacca extruder with an approximately 1.0 to 5.0 minute residence time at a barrel set temperature of 240-280 degrees Celsius. The clear, green extrudate was pressed into a 1.0 mm thick disk and cooled in dry ice to remain clear. Continued cooling for 10 to 30 minutes provided clear green disks where the PEG had at least partially crystallized (~50%). The resulting discs were suitable for writing holograms. The crystallization temperature (Tc), heat of crystallization ($\Delta H_{cryst}$), melting temperature (Tm), and heat of melting ($\Delta H_{melt}$) were determined. The results are displayed in Table 2.

TABLE 2

| PS-PMMA (wt %) | PEG M$_n$ | PEG (wt %) | Tc (° C.)/ΔHcryst (J/g) | Tm (° C.)/ΔHmelt (J/g) |
|---|---|---|---|---|
| 85 | 4600 | 15 | −23/1.07 | 59.4/2.02 |
| 83 | 4600 | 17 | −21.6/4.6 | 60.5/7.2 |
| 80 | 8000 | 20 | −21.8/15.7 | 62.6/25 |
| 81.5 | 8000 | 18.5 | −23.5/8.4 | 62.1/13.2 |
| 82.5 | 8000 | 17.5 | −23.0/5.9 | 61.7/9.5 |
| 85 | 8000 | 15 | −22.5/0.6 | 60.8/1.1 |
| 82.5 | 10000 | 17.5 | −21.4/9.1 | 64.4/19.2 |
| — | injection molded disc | — | −23.1/6.8 | 61.9/11 |
| — | injection molded disc | — | −22.9/6.8 | 62.4/11.2 |

All ranges disclosed herein are inclusive of the endpoints, and the endpoints are combinable with each other. The terms "first," "second," and the like as used herein do not denote any order, quantity, or importance, but rather are used to distinguish one element from another. The modifiers "about" and "approximately" used in connection with a quantity are inclusive of the stated value and have the meaning dictated by the context (e.g., includes the degree of error associated with measurement of the particular quantity). The use of the terms "a" and "an" and "the" and similar referents in the context of describing the invention (especially in the context of the following claims) are to be construed to cover both the singular and the plural, unless otherwise indicated herein or clearly contradicted by context.

While the invention has been described in detail in connection with a number of embodiments, the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A method for storing holographic data, comprising the steps of:
    (a) providing an optically transparent substrate comprising a polymer composite and a light absorbing chromophore, wherein the polymer composite is prepared by melt blending and comprises:
        an amorphous polymer, wherein the amorphous polymer comprises poly(styrene-co-methyl methacrylate); and
        a crystallizable polymer, wherein the crystallizable polymer comprises polyethylene glycol;
    wherein upon cooling the polymer composite, the amorphous polymer forms a continuous phase and the crystallizable polymer forms a dispersed phase, and wherein the dispersed phase is less than 200 nanometers in size and wherein the polymer composite has an optical transparency of at least 65 percent, and wherein the light absorbing chromophore is attached to the polymer composite; and
    (b) irradiating a volume element of the optically transparent substrate with a holographic interference pattern, wherein the pattern has a first wavelength and an intensity both sufficient to cause a phase change in at least a portion of the dispersed phase within the volume element of the substrate to produce within the irradiated volume element refractive index variations corresponding to the holographic interference pattern, thereby producing an optically readable datum corresponding to the volume element wherein said phase change is a change from a crystalline to an amorphous state.

2. The method according to claim 1, wherein said dispersed phase is less than about 40 nanometers in size.

3. The method according to claim 1, wherein said light absorbing chromophore is a linearly responsive absorber.

4. The method according to claim 1, wherein said light absorbing chromophore is a reverse saturable absorber.

5. The method according to claim 1, wherein said first wavelength is in a range from about 300 nanometers to about 800 nanometers.

* * * * *